(12) United States Patent
Bin Hud et al.

(10) Patent No.: US 12,021,011 B2
(45) Date of Patent: Jun. 25, 2024

(54) SOLDER SURFACE FEATURES FOR INTEGRATED CIRCUIT PACKAGES

(71) Applicant: TEXAS INSTRUMENTS INCORPORATED, Dallas, TX (US)

(72) Inventors: Amirul Afiq Bin Hud, Melaka (MY); Wei Fen Sueann Lim, Melaka (MY); Adi Irwan Bin Herman, Selangor (MY)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 50 days.

(21) Appl. No.: 17/458,667

(22) Filed: Aug. 27, 2021

(65) Prior Publication Data

US 2023/0069741 A1    Mar. 2, 2023

(51) Int. Cl.
*H01L 23/495*    (2006.01)
*H01L 21/48*    (2006.01)

(52) U.S. Cl.
CPC .... *H01L 23/49555* (2013.01); *H01L 21/4821* (2013.01)

(58) Field of Classification Search
CPC .............. H01L 23/49555; H01L 21/4821
See application file for complete search history.

(56) References Cited

U.S. PATENT DOCUMENTS

| | | | |
|---|---|---|---|
| 2010/0133693 A1* | 6/2010 | Arshad | H01L 23/49503 257/762 |
| 2010/0147558 A1* | 6/2010 | Pon | H05K 3/3426 174/250 |
| 2012/0104584 A1* | 5/2012 | Chen | H01L 21/568 257/676 |
| 2016/0183369 A1* | 6/2016 | Talledo | H01L 23/49548 361/767 |
| 2019/0214334 A1* | 7/2019 | Ikeda | H01L 23/49582 |
| 2021/0217686 A1* | 7/2021 | Bin Hud | H01L 23/3121 |

* cited by examiner

*Primary Examiner* — David Vu
*Assistant Examiner* — Brandon C Fox
(74) *Attorney, Agent, or Firm* — Ronald O. Neerings; Frank D. Cimino

(57) ABSTRACT

One example described herein includes an integrated circuit (IC) package. The IC package includes a semiconductor die comprising an IC and an IC package enclosure that substantially encloses the semiconductor die. The IC package also includes at least one conductive metal contact. Each of the at least one conductive metal contact is coupled to the semiconductor die and comprises a planar solder surface exterior to the IC package enclosure to which the respective at least one metal contact is soldered to an external conductive metal contact. The planar solder surface includes at least one solder surface feature.

16 Claims, 5 Drawing Sheets

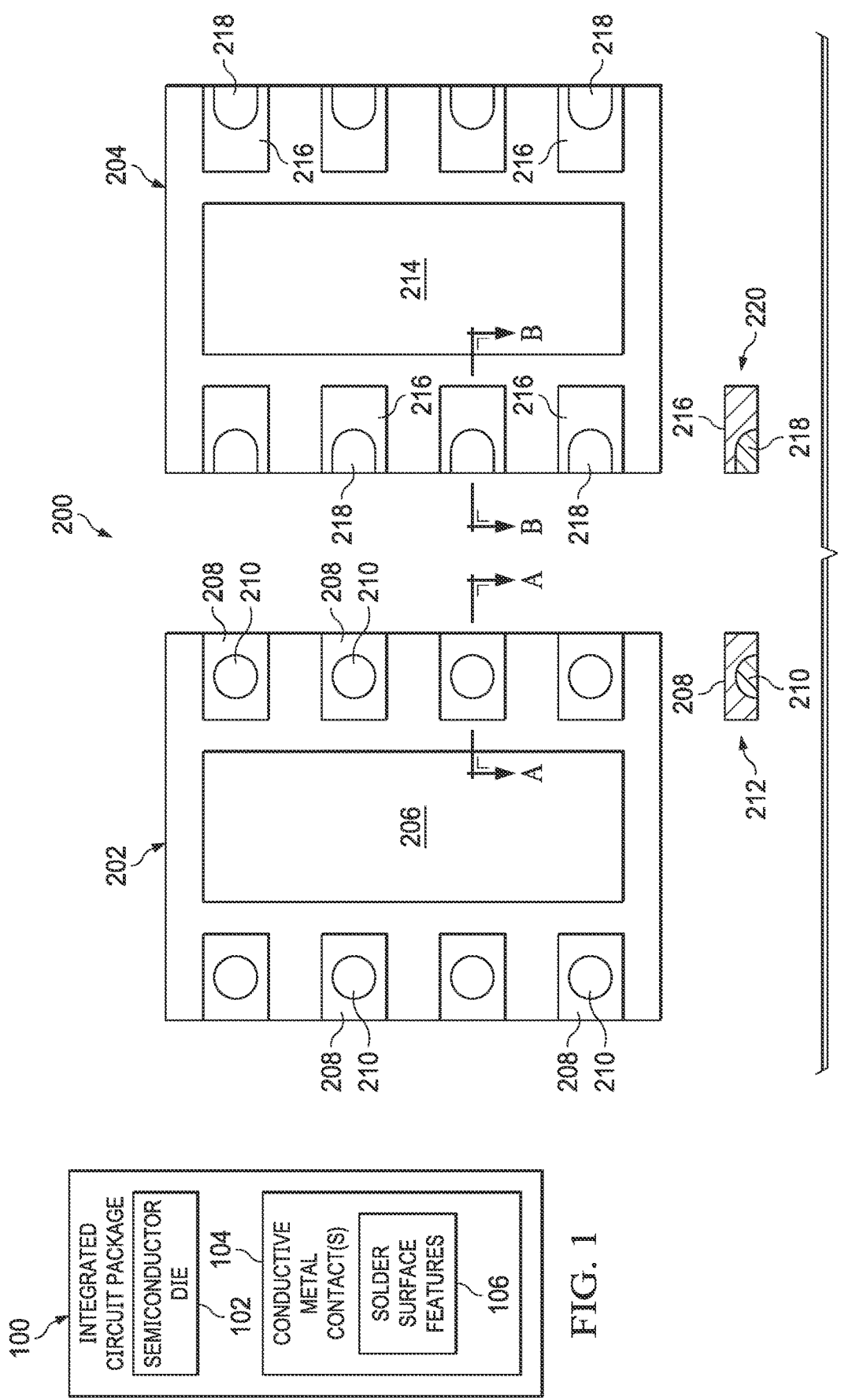

SOLDER SURFACE FEATURES FOR INTEGRATED CIRCUIT PACKAGES

TECHNICAL FIELD

This description relates generally to electronic circuits, and more particularly to solder surface features for integrated circuit packages.

BACKGROUND

Integrated circuits (ICs) form the basis for modern computing, in which semiconductor dies that include ICs are fabricated based on etching and layering different materials. The semiconductor dies are combined with conductive metal that forms ground pads and leads and are packaged in packaging material to form IC packages. The ground pads and/or leads can be conductively coupled to external conductive metal contacts, such as on a printed circuit board (PCB), via a solder material. Upon cooling and solidification, the solder can form an electrical connection between the leads and/or ground pad to the respective external conductive metal contacts. In some cases and/or under certain circumstances (e.g., environment-based circumstances), the solid solder material can crack, which can lead to poor conductivity of electrical signals or ground connections between the semiconductor die and the external conductive metal contacts.

SUMMARY

One example described herein includes an integrated circuit (IC) package. The IC package includes a semiconductor die comprising an IC and an IC package enclosure that substantially encloses the semiconductor die. The IC package also includes at least one conductive metal contact. Each of the at least one conductive metal contact is coupled to the semiconductor die and comprises a planar solder surface exterior to the IC package enclosure to which the respective at least one metal contact is soldered to an external conductive metal contact. The planar solder surface includes at least one solder surface feature.

Another example described herein includes a method for fabricating an integrated circuit (IC) package. The method includes fabricating a semiconductor die that comprises an IC and forming at least one conductive metal contact. Each of the at least one conductive metal contact comprising a planar solder surface to which the respective at least one conductive metal contact is soldered to an external conductive metal contact. The method also includes forming at least one solder surface feature in the planar solder surface. The at least one solder surface feature can be configured to increase surface area of contact of a solder material on the at least one conductive metal contact relative to the planar solder surface. The method further includes coupling the at least one conductive metal contact to the semiconductor die and coupling the at least one conductive metal contact and the semiconductor die to an IC package enclosure to form the IC package.

Another example described herein includes an integrated circuit (IC) package. The IC package includes a semiconductor die comprising an IC and an IC package enclosure that substantially encloses the semiconductor die. The IC package also includes at least one conductive metal contact. Each of the at least one conductive metal contact is coupled to the semiconductor die and comprises a planar solder surface exterior to the IC package enclosure to which the respective at least one metal contact is soldered to an external conductive metal contact. The planar solder surface includes at least one solder surface feature configured to increase surface area of contact of a solder material on the at least one conductive metal contact relative to the planar solder surface.

BRIEF DESCRIPTION OF THE DRAWINGS

FIG. 1 is an example of a block diagram of an IC package.

FIG. 2 is an example diagram of integrated circuit packages.

DETAILED DESCRIPTION

Figure 3:
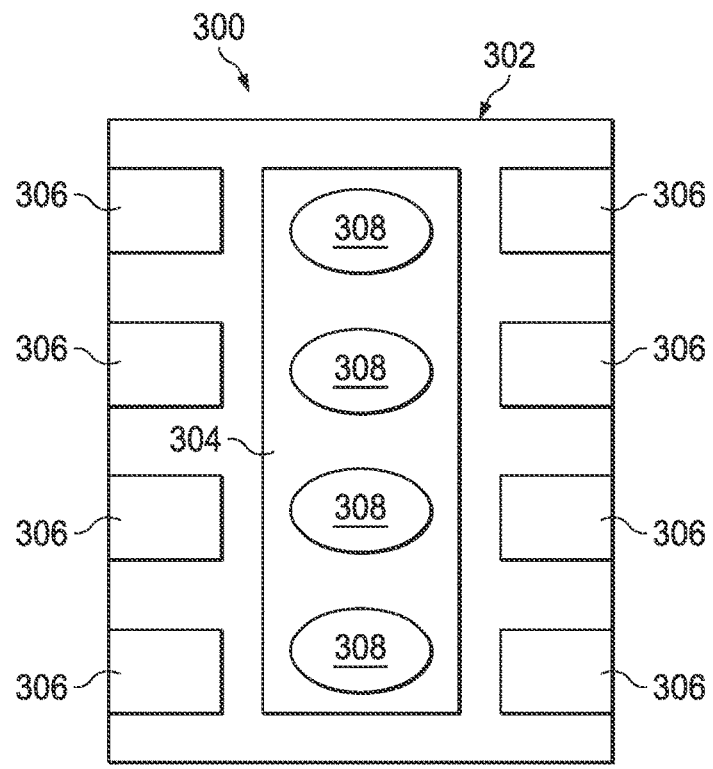
FIG. 3 is an example diagram of an integrated circuit package.

This description relates generally to electronic circuits, and more particularly to solder surface features for integrated circuit packages. The solder features can be formed as solder surface features on a planar solder surface of conductive metal contacts (e.g., leads, signal pads, ground pads, etc.) for an IC package. The solder surface features can be configured to increase surface area contact of solder material to the respective conductive metal contacts to provide a better conductive connection between the conductive metal contacts and external conductive metal contacts.

Multiple examples of solder surface features are described herein. The solder surface features can be formed as recesses in leads, signal pads, and/or ground pads. As an example, the recesses can be surrounded by the planar solder surface of the conductive metal contacts. As another example, the recesses can be partially surrounded by the planar solder surface of the conductive metal contacts, such that the recesses are formed at an edge of the conductive metal contacts. The solder surface features can also be formed as one or more through-holes, such as through conductive metal contacts arranged as leads. As yet another example, the solder surface features can be formed as slots at respective edges of the conductive metal contacts.

Based on any of the different arrangements of the solder surface features, the conductive metal contacts can be soldered to the corresponding external conductive metal contacts with a greater surface area of contact of the solder material to the conductive metal contacts. As a result, even in response to cracking of the solder joint between the conductive metal contacts and the external conductive metal contacts, the solder can provide a sufficient conductive coupling between the conductive metal contacts and the respective external conductive metal contacts.

FIG. 1 is an example of a block diagram of an integrated circuit (IC) package 100. The IC package 100 can be implemented in any of a variety of computer or circuit systems. The IC package 100 includes a semiconductor die 102 that can include an IC. The semiconductor die 102 can be fabricated, for example, based on steps of material deposition and etching to form the respective IC. As an example, the semiconductor die 102 can also include conductive metal regions. As another example, the IC package 100 can include an IC package enclosure (not shown) formed from a dielectric material (e.g., plastic) surrounds the semiconductor die 102.

The IC package 100 also includes at least one conductive metal contact 104 that is electrically coupled to the semiconductor die. As an example, the conductive metal contact(s) 104 are conductively coupled to the semiconductor die 102 to provide electrical connectivity between the semiconductor die 102 and external conductive metal contacts to provide electrical interaction with other devices in an associated computer system. As an example, the conductive metal contact(s) 104 can be configured as leads that extend from the associated IC package enclosure. As another example, the conductive metal contact(s) 104 can be configured as signal pads and/or ground pads, such as in a quad flat no lead (QFN) IC package. Thus, the IC package 100 can be fabricated in any of a variety of forms.

In the example of FIG. 1, the conductive metal contact(s) 104 include one or more solder surface features 106. The solder surface feature(s) 106 can be formed on a planar solder surface of the respective conductive metal contact(s) 104. As described herein, the term "solder surface feature" refers to an interruption in the planar solder surface that extends inward (e.g., concave) with respect to the planar solder surface and which is disposed within the outer geometric boundaries formed by the extensions of the periphery of the planar solder surface. The solder surface feature(s) 106 are thus configured to increase a surface area of contact of a solder material with the respective conductive metal contact(s) 104 for soldering the respective conductive metal contact(s) 104 to respective external conductive metal contacts. For example, the solder joint between a conductive metal contact and the external conductive metal contacts can crack or degrade over time, such as resulting from environmental conditions (e.g., thermal changes and/or vibration), resulting in a loss of conductivity between the conductive metal contact of a typical IC package and a respective external conductive metal contact. However, as described herein, the greater surface area of contact of the solder material to the conductive metal contact(s) 104 can result in sufficient conductive coupling between the conductive metal contact(s) 104 and the respective external conductive metal contacts, even in response to cracking of the solder joint between the conductive metal contact(s) 104 and the external conductive metal contacts.

FIG. 2 is an example diagram 200 of IC packages. The IC packages include a first IC package 202 and a second IC package 204. Each of the IC packages 202 and 204 can correspond to the IC package 100 in the example of FIG. 1. Therefore, reference is to be made to the example of FIG. 1 in the following description of the example of FIG. 2.

The first and second IC packages 202 and 204 are demonstrated, by example, as QFN IC packages. The first IC package 202 includes a ground pad 206 and a plurality of signal pads 208. Each of the signal pads 208 can correspond to one of the conductive metal contact(s) 104 in the example of FIG. 1. Therefore, each of the signal pads 208 includes a solder surface feature 210 that is formed on a planar solder surface of the respective signal pad 208. In the example of FIG. 1, the solder surface feature 210 is formed as a recess in the planar solder surface of the respective signal pad 208, such that the solder surface feature 210 is a concave indentation in the planar solder surface of the signal pad 208. The recess corresponding to the solder surface feature 210 is entirely surrounded by the planar solder surface of the respective signal pad 208 of the first IC package 202. A cross-sectional view of the signal pad 208 along "A" is demonstrated generally at 212, which demonstrates the solder surface feature 210 as a semi-spherical recess in the planar solder surface of the signal pad 208. However, the recess corresponding to the solder surface feature 210 is not limited to having a round or spherical interior surface, but can instead be any of a variety of shapes (e.g., a square or rectangular recess, etc.).

The second IC package 204 includes a ground pad 214 and a plurality of signal pads 216. Each of the signal pads 216 can correspond to one of the conductive metal contact(s) 104 in the example of FIG. 1. Therefore, each of the signal pads 216 includes a solder surface feature 218 that is formed on a planar solder surface of the respective signal pad 216. In the example of FIG. 2, the solder surface feature 218 is formed as a recess in the planar solder surface of the respective signal pad 216, such that the solder surface feature 218 is a concave indentation in the planar solder surface of the respective signal pad 216. The recess corresponding to the solder surface feature 218 is partially surrounded by the planar solder surface of the respective signal pad 216 of the second IC package 204, such that the recess is open with respect to an edge of the respective signal pad 216 (e.g., exterior edge in the example of FIG. 2). A cross-sectional view of the respective signal pad 216 along "B" is demonstrated generally at 220, which demonstrates the solder surface feature 218 as having a semi-spherical cross-sectional dimension that is open to the exterior edge of the respective signal pad 216. However, the recess corresponding to the solder surface feature 218 is not limited to having a round or semi-spherical interior shapes, but can instead be any of a variety of shapes (e.g., a square or rectangular recess, etc.).

The recesses corresponding to the respective solder surface features 210 and 218 therefore increase a surface area for contact with a solder material for soldering the respective IC packages 202 and 204 to external conductive metal contacts (e.g., on a PCB). For example, solder material can be applied to the planar solder surfaces of the respective signal pads 208 and 216, such that the solder material can fill the concave voids formed by the respective recesses corresponding to the solder surface features 210 and 218. Therefore, a larger amount of solder material can couple to the respective signal pads 208 and 216 than on a typical signal pad that is arranged merely as a planar surface (and therefore absent a solder surface feature). Accordingly, the solder surface features 210 and 218 can ensure a sufficient electrical connection of the respective signal pads 208 and 216 to the external conductive metal contacts, even in response to cracking of the solder joint between the respective signal pads 208 and 216, such as resulting from environmental stresses (e.g., thermal or vibrational stresses).

FIG. 3 is an example diagram 300 of an IC package 302. The IC package 302 can correspond to the IC package 100 in the example of FIG. 1. Therefore, reference is to be made to the example of FIG. 1 in the following description of the example of FIG. 3.

The IC package 302 is demonstrated, by example, as a QFN IC package. The IC package 302 includes a ground pad 304 and a plurality of signal pads 306. In the example of FIG. 3, the ground pad 304 can correspond to one of the conductive metal contact(s) 104 in the example of FIG. 1. Therefore, the ground pad 304 is demonstrated in the example of FIG. 3 as including a plurality of solder surface features 308 that are formed on the planar solder surface of the ground pad 304. The solder surface features 308 are formed as recesses in the planar solder surface of the ground pad 304, similar to as described above in the example of FIG. 2.

In the example of FIG. 3, the solder surface features 308 are demonstrated as concave oblong indentations in the planar solder surface of the ground pad 304. The recesses corresponding to the solder surface features 308 are each entirely surrounded by the planar solder surface of the ground pad 304 of the IC package 302. However, the recesses corresponding to the solder surface features 308 can alternatively be arranged as partially surrounded with an opening at the edge(s) of the ground pad 304, similar to as described above regarding the example of FIG. 2, or can include a combination of fully and partially surrounded recesses. Additionally, the recess corresponding to the solder surface features 308 are not limited to having oblong shapes, but could instead have round or spherical interior surfaces, or be any of a variety of other shapes (e.g., a square or rectangular recess, etc.).

The solder surface features 308 can therefore increase a surface area of the ground pad 304 for contact with a solder material for soldering the respective IC package 302 to an external conductive metal contact (e.g., on a PCB). For example, solder material can be applied to the planar solder surface of the ground pad 304, such that the solder material can fill the concave voids formed by the respective recesses corresponding to the solder surface features 308. Therefore, a larger amount of solder material can couple to the respective ground pad 304 than on a typical ground pad that is arranged merely as a planar surface (and therefore absent a solder surface feature). Accordingly, the solder surface feature 308 can ensure a sufficient ground connection of the respective ground pad 304 to the external conductive metal contact, even in response to cracking of the solder joint between the respective ground pad 304, such as resulting from environmental stresses (e.g., thermal or vibrational stresses).

Figure 4:
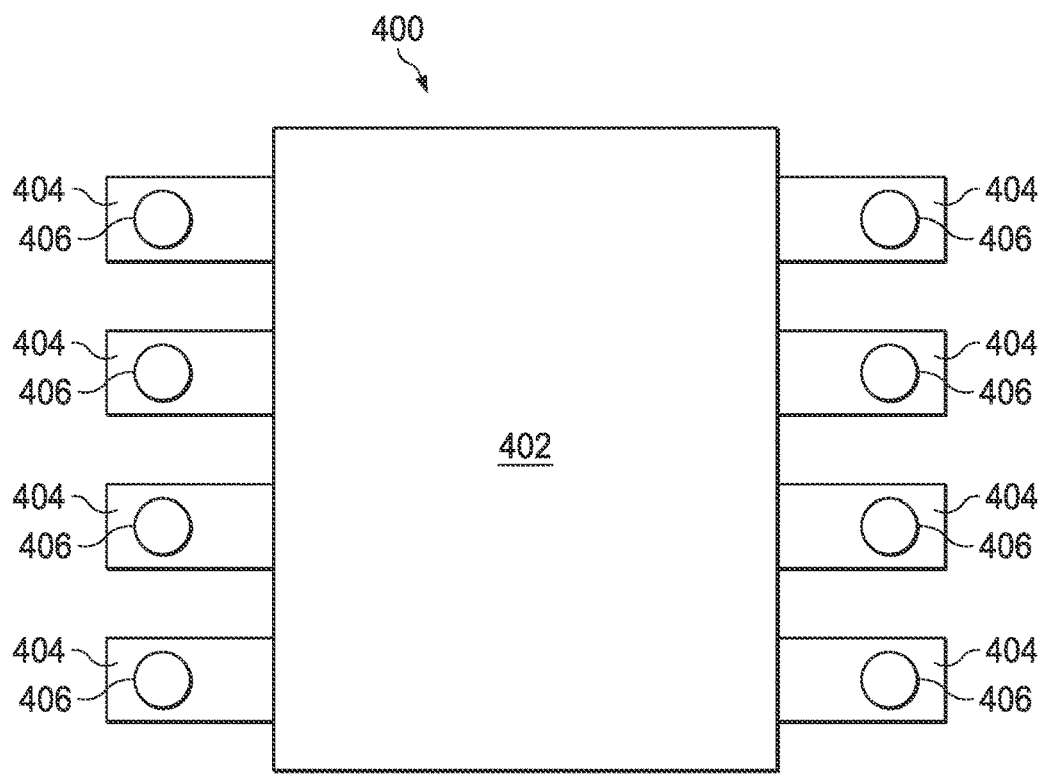
FIG. 4 is another example diagram of an integrated circuit package.

FIG. 4 is an example diagram 400 of an IC package 402. The IC package 402 can correspond to the IC package 100 in the example of FIG. 1. Therefore, reference is to be made to the example of FIG. 1 in the following description of the example of FIG. 4.

The IC package 402 is demonstrated, by example, as a leaded IC package. The IC package 402 includes a plurality of leads 404. In the example of FIG. 4, the leads 404 can correspond to one of the conductive metal contact(s) 104 in the example of FIG. 1. Therefore, each of the leads 404 is demonstrated in the example of FIG. 4 as including a solder surface feature 406 that is formed on the planar solder surface of the respective lead 404. The solder surface feature 406 is formed as a through-hole in the planar solder surface of the respective lead 404, and therefore through the entire lead 404.

In the example of FIG. 4, the solder surface feature 406 is demonstrated as round through-hole in the planar solder surface that extends through the lead 404 (e.g., to a surface of the lead 404 opposite the planar solder surface). The through-hole corresponding to the solder surface feature 406 is entirely surrounded by the planar solder surface of the respective lead 404 of the IC package 402. However, the through-hole corresponding to the solder surface feature 406 is not limited to having a round cross-sectional shape, but could instead have any of a variety of other shapes (e.g., a square or rectangular recess, etc.).

The solder surface feature 406 can therefore increase a surface area of the of the respective lead 404 for contact with a solder material for soldering the respective IC package 402 to an external conductive metal contact (e.g., on a PCB). For example, solder material can be applied to the planar solder surface of the lead 404, such that the solder material can fill the through-hole corresponding to the solder surface feature 406. Therefore, a larger amount of solder material can couple to the respective lead 404 than on a typical lead (and therefore absent a solder surface feature). Accordingly, the solder surface feature 406 can ensure a sufficient electrical connection of the respective lead 404 to the external conductive metal contact, even in response to cracking of the solder joint between the respective lead 404, such as resulting from environmental stresses (e.g., thermal or vibrational stresses).

Figure 5:
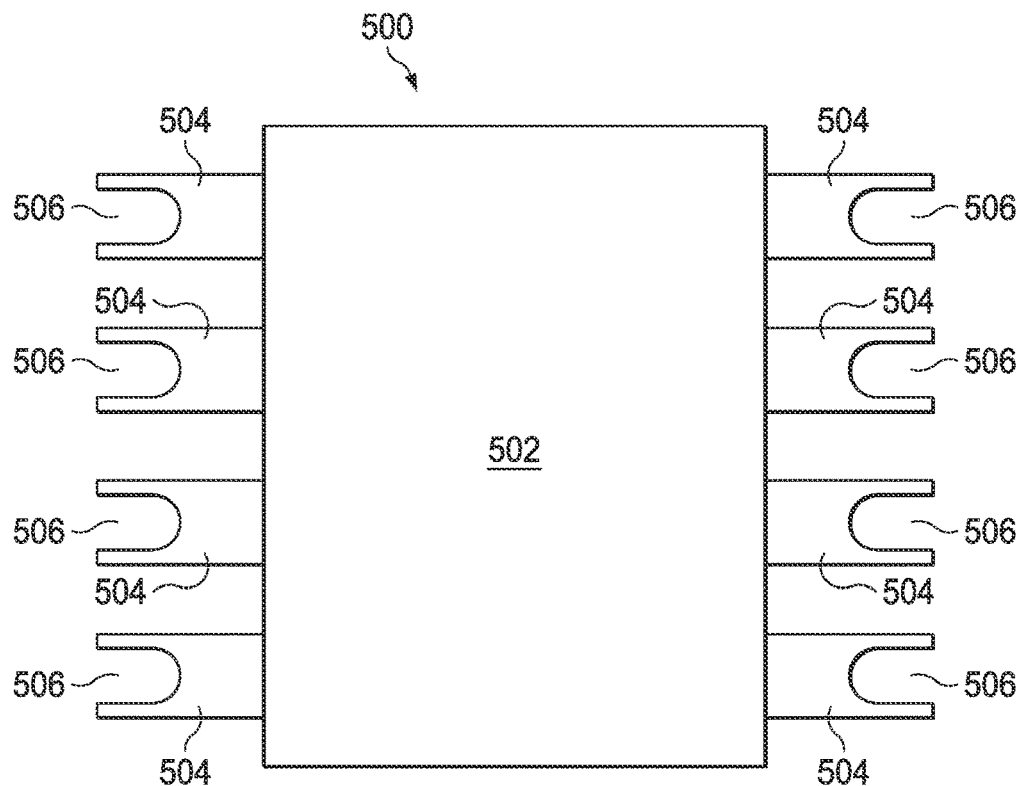
FIG. 5 is another example diagram of an integrated circuit package.

FIG. 5 is an example diagram 500 of an IC package 502. The IC package 502 can correspond to the IC package 100 in the example of FIG. 1. Therefore, reference is to be made to the example of FIG. 1 in the following description of the example of FIG. 5.

The IC package 502 is demonstrated, by example, as a leaded IC package. The IC package 502 includes a plurality of leads 504. In the example of FIG. 5, the leads 504 can correspond to one of the conductive metal contact(s) 104 in the example of FIG. 1. Therefore, each of the leads 504 is demonstrated in the example of FIG. 5 as including a solder surface feature 506 that is formed on the planar solder surface of the respective lead 504. The solder surface feature 506 is formed as a slot that is open at an edge of the respective lead 504. As described herein, the slot at the edge of the lead 504 extends through the entire lead 504, therefore increasing the surface area of the edge of the lead 504.

In the example of FIG. 5, the solder surface feature 506 is demonstrated as semi-circular slot in the planar solder surface that extends through the lead 504 (e.g., to a surface of the lead 504 opposite the planar solder surface). The slot corresponding to the solder surface feature 506 is partially surrounded by the planar solder surface of the respective lead 504 of the IC package 502, similar to the partially surrounded recess formed in the signal pads 216 in the example of FIG. 2. However, the slot corresponding to the solder surface feature 506 is not limited to having a rounded cross-sectional shape, but could instead have any of a variety of other shapes (e.g., a square or rectangular recess, etc.).

The solder surface feature 506 can therefore increase a surface area of the of the respective lead 504 for contact with a solder material for soldering the respective IC package 502 to an external conductive metal contact (e.g., on a PCB). For example, solder material can be applied to the planar solder surface of the lead 504 (and to the inside of the solder surface feature 506), such that the solder material can fill the slot corresponding to the solder surface feature 506. Therefore, a larger amount of solder material can couple to the respective lead 504 than on a typical lead (and therefore absent a solder surface feature). Accordingly, the solder surface feature 506 can ensure a sufficient electrical connection of the respective lead 504 to the external conductive metal contact, even in response to cracking of the solder joint between the respective lead 504, such as resulting from environmental stresses (e.g., thermal or vibrational stresses).

Figure 6:
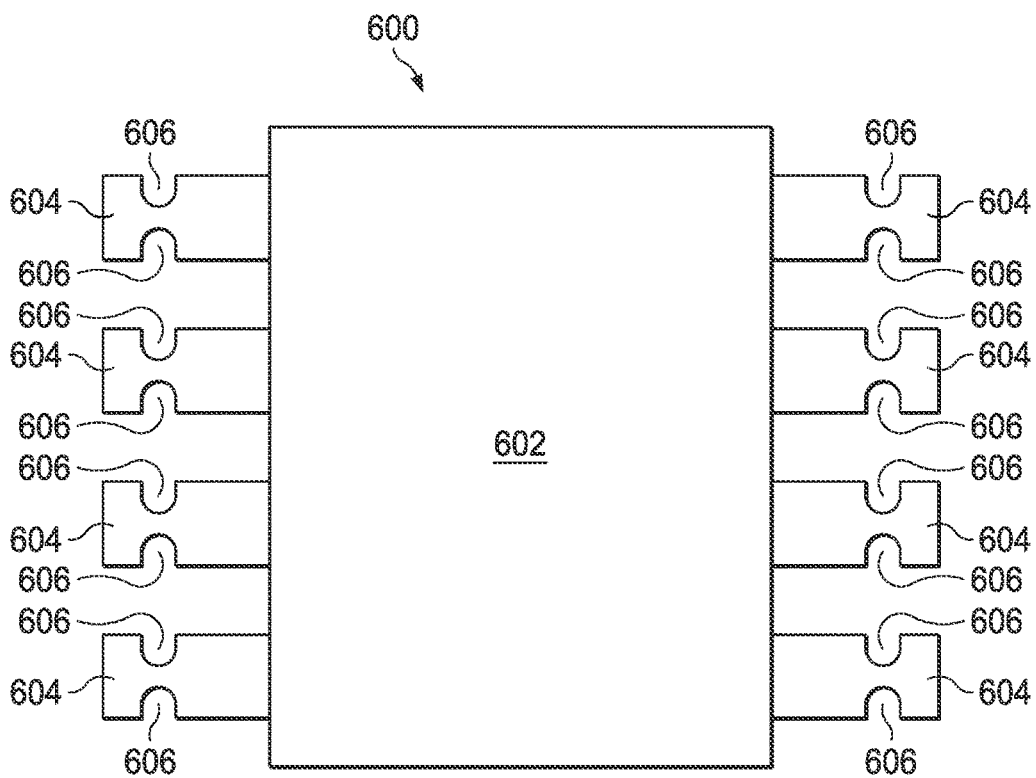
FIG. 6 is another example diagram of an integrated circuit package.

FIG. 6 is an example diagram 600 of an IC package 602. The IC package 602 can correspond to the IC package 100 in the example of FIG. 1. Therefore, reference is to be made to the example of FIG. 1 in the following description of the example of FIG. 6.

The IC package 602 is demonstrated, by example, as a leaded IC package. The IC package 602 includes a plurality of leads 604. In the example of FIG. 6, the leads 604 can correspond to one of the conductive metal contact(s) 104 in the example of FIG. 1. Therefore, each of the leads 604 is demonstrated in the example of FIG. 6 as including solder surface features 606 that is formed on the planar solder surface of the respective lead 604. The solder surface features 606 are formed as a pair of slots that are open at opposite edges (e.g., lateral edges) of the respective lead 604. As described herein, the slots at the opposite edges of the lead 604 extend through the entire lead 604, therefore increasing the surface area of the respective opposite edges of the lead 604.

In the example of FIG. 6, the solder surface features 606 are demonstrated as semi-circular slots in the planar solder surface that extends through the lead 604 (e.g., to a surface of the lead 604 opposite the planar solder surface). The slots corresponding to the solder surface features 606 are each partially surrounded by the planar solder surface of the respective lead 604 of the IC package 602, similar to the partially surrounded recess formed in the signal pad 216 in the example of FIG. 2. However, the slots corresponding to the solder surface features 606 are not limited to having rounded cross-sectional shapes, but could instead have any of a variety of other shapes (e.g., a square or rectangular recess, etc.). Additionally, the solder surface features 606 are not limited to being arranged on opposite edges of the lead 604, and are not limited to a pair of slots (e.g., the quantity of slots can be greater than two). Furthermore, the location of the slots can vary from one edge of the lead 604 to the other, or from one lead 604 to another. Therefore the solder surface features 606 can be arranged in a variety of different ways.

The solder surface features 606 can therefore increase a surface area of the of the respective lead 604 for contact with a solder material for soldering the respective IC package 602 to an external conductive metal contact (e.g., on a PCB). For example, solder material can be applied to the planar solder surface of the lead 604 (and to the inside of the solder surface features 606), such that the solder material can fill the slots corresponding to the solder surface features 606. Therefore, a larger amount of solder material can couple to the respective lead 604 than on a typical lead (and therefore absent a solder surface features). Accordingly, the solder surface features 606 can ensure a sufficient electrical connection of the respective lead 604 to the external conductive metal contact, even in response to cracking of the solder joint between the respective lead 604, such as resulting from environmental stresses (e.g., thermal or vibrational stresses).

Figure 7:
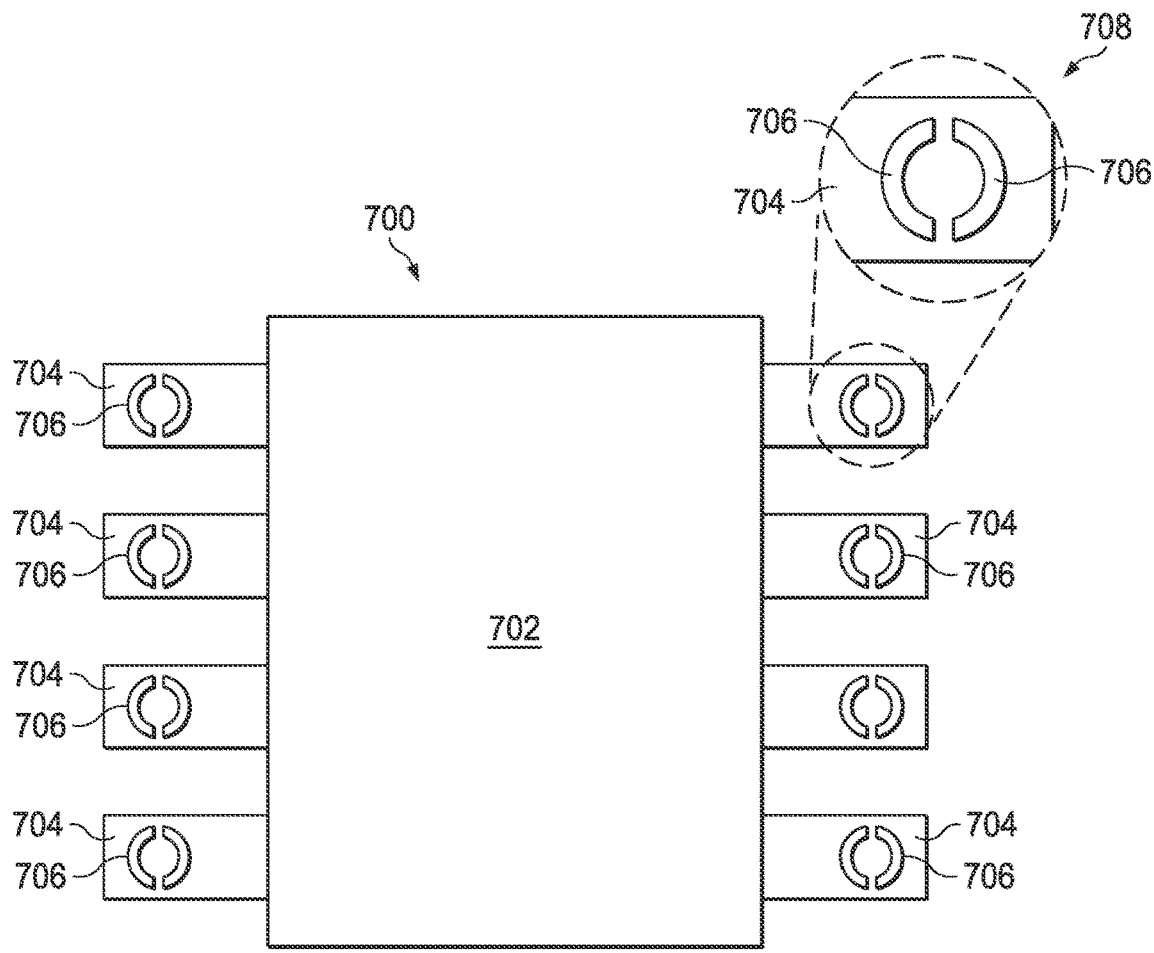
FIG. 7 is another example diagram of an integrated circuit package.

FIG. 7 is an example diagram 700 of an IC package 702. The IC package 702 can correspond to the IC package 100 in the example of FIG. 1. Therefore, reference is to be made to the example of FIG. 1 in the following description of the example of FIG. 7.

The IC package 702 is demonstrated, by example, as a leaded IC package. The IC package 702 includes a plurality of leads 704. In the example of FIG. 7, the leads 704 can correspond to one of the conductive metal contact(s) 104 in the example of FIG. 1. Therefore, each of the leads 704 is demonstrated in the example of FIG. 7 as including a solder surface feature 706 that is formed on the planar solder surface of the respective lead 704. The solder surface feature 706 is formed as a plurality of through-holes in the planar solder surface of the respective lead 704, and therefore through the entire lead 704.

In the example of FIG. 7, the solder surface feature 706 is demonstrated as two curved through-holes in the planar solder surface that extends through the lead 704 (e.g., to a surface of the lead 704 opposite the planar solder surface), as demonstrated in the exploded view at 708. The through-holes corresponding to the solder surface feature 706 are completely surrounded by the planar solder surface of the respective lead 704 of the IC package 702. However, the through-holes corresponding to the solder surface feature 706 are not limited to the curved arrangement in the example of FIG. 7, but can instead be any of a variety of cross-sectional shapes and arrangements with respect to each other.

The solder surface feature 706 can therefore increase a surface area of the of the respective lead 704 for contact with a solder material for soldering the respective IC package 702 to an external conductive metal contact (e.g., on a PCB). For example, solder material can be applied to the planar solder surface of the lead 704, such that the solder material can fill the through-holes corresponding to the solder surface feature 706. Therefore, a larger amount of solder material can couple to the respective lead 704 than on a typical lead (and therefore absent a solder surface feature). Accordingly, the solder surface feature 706 can ensure a sufficient electrical connection of the respective lead 704 to the external conductive metal contact, even in response to cracking of the solder joint between the respective lead 704, such as resulting from environmental stresses (e.g., thermal or vibrational stresses).

Figure 8:
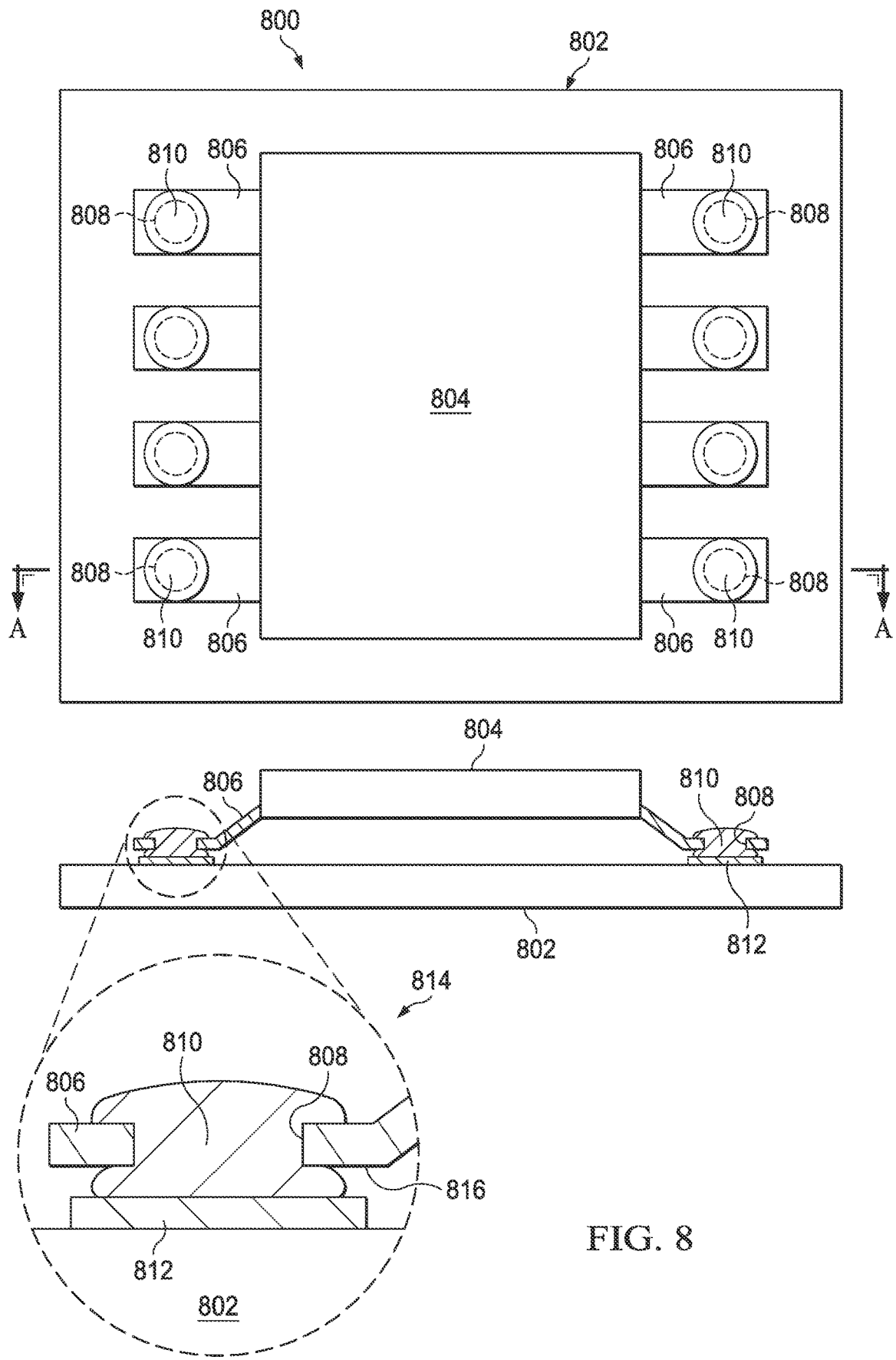
FIG. 8 is an example diagram of a printed circuit board.

FIG. 8 is an example diagram 800 of a printed circuit board system. The diagram 800 includes a PCB 802 on which an IC package 804 is mounted. The IC package 804 is demonstrated in the example of FIG. 8 as similar to the IC package 402 in the example of FIG. 4. Therefore, reference is to be made to the example of FIG. 4. However, other IC packages described herein could be implemented in the PCB system in the diagram 800.

As described above, the IC package 804 includes a plurality of leads 806 that each include a solder surface feature 808 that is formed on the planar solder surface of the respective lead 806. The solder surface feature 808 is formed as a through-hole in the planar solder surface of the respective lead 806. The diagram 800 demonstrates that a solder material 810 has been applied to solder each of the leads 806 to a respective external conductive metal contact 812. The diagram 800 includes a cross-sectional view along "A", as well as an exploded view 814, to better demonstrate the soldering of the leads 806 to the respective external conductive metal contacts 812 via the solder material 810.

Similar to as described above, the solder material 810 fills the through-hole corresponding to the solder surface feature 808, and flows out from the top surface of the lead 806 as well as the planar solder surface, demonstrated at 816, between the lead 806 and the respective external conductive metal contact 812. The solder surface feature 808 therefore increases a surface area of the respective lead 806 for contact with a solder material for soldering the respective IC package 804 to the external conductive metal contacts 812 on the PCB 802. Accordingly, the solder surface feature 808 can ensure a sufficient electrical connection of the respective lead 806 to the external conductive metal contact 812, even in response to cracking of the solder joint between the respective lead 806, such as resulting from environmental stresses (e.g., thermal or vibrational stresses).

Figure 9:
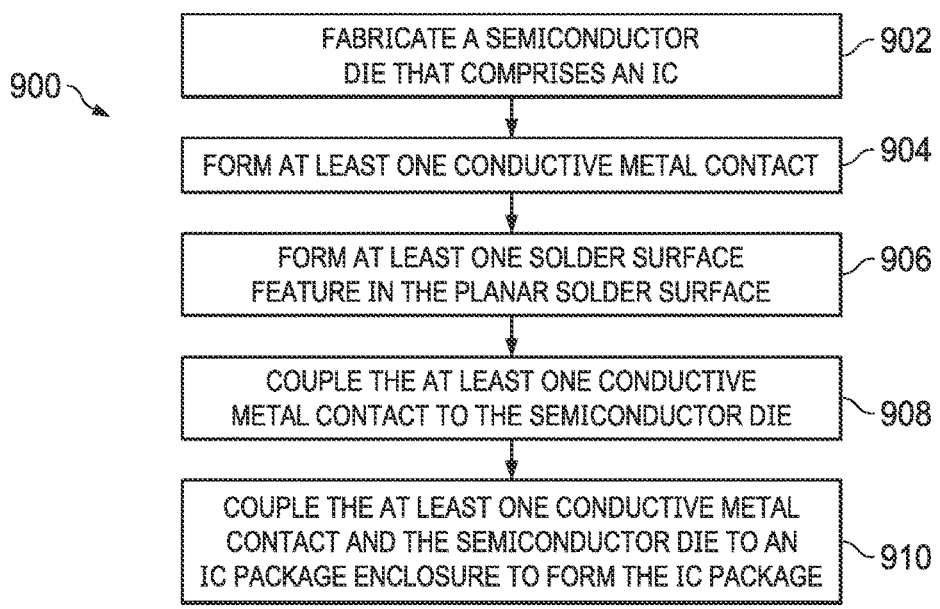
FIG. 9 is an example of a method for fabricating an IC package.

In view of the foregoing structural and functional features described above, a methodology in accordance with various aspects of the present invention will be better appreciated with reference to FIG. 9. While, for purposes of simplicity of explanation, the methodology of FIG. 9 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 9 is an example of a method 900 for fabricating an IC package (e.g., the IC package 100). At 902, a semiconductor die (e.g., the semiconductor die 102) that comprises an IC is fabricated. At 904, at least one conductive metal contact (e.g., the conductive metal contact(s) 104) is formed. Each of the at least one conductive metal contact includes a planar solder surface (e.g., the planar solder surface 816) to which the respective at least one conductive metal contact is soldered to an external conductive metal contact (e.g., the external conductive metal contact 812). At 906, at least one solder surface feature (e.g., the solder surface feature 106) is formed in the planar solder surface. The at least one solder surface feature can be configured to increase surface area of contact of a solder material (e.g., the solder material 810) on the at least one conductive metal contact. At 908, the at least one conductive metal contact is coupled to the semiconductor die. At 910, the at least one conductive metal contact and the semiconductor die is coupled to an IC package enclosure to form the IC package.

In this description, the term "couple" may cover connections, communications, or signal paths that enable a functional relationship consistent with this description. For example, if device A generates a signal to control device B to perform an action, then: (a) in a first example, device A is directly coupled to device B; or (b) in a second example, device A is indirectly coupled to device B through intervening component C if intervening component C does not substantially alter the functional relationship between device A and device B, so device B is controlled by device A via the control signal generated by device A.

Also, in this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device described herein as including certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor wafer and/or integrated circuit (IC) package) and may be configured to couple to at least some of the passive elements and/or the sources to form the described structure, either at a time of manufacture or after a time of manufacture, such as by an end user and/or a third party.

Modifications are possible in the described embodiments, and other embodiments are possible, within the scope of the claims.

What is claimed is:

1. An integrated circuit (IC) package comprising:
   a semiconductor die comprising an IC;
   an IC package enclosure that substantially encloses the semiconductor die; and
   a conductive metal contact coupled to the semiconductor die, the conductive metal contact including a planar solder surface exposed on an exterior surface of the IC package enclosure, the planar solder surface further including at least one concave oblong indentation in the planar solder surface that does not extend to any other surface of the conductive metal contact.

2. The IC package of claim 1, wherein the at least one concave oblong indentation in the planar solder surface is configured to increase surface area of contact of a solder material on the conductive metal contact relative to the planar solder surface.

3. The IC package of claim 1, wherein the at least one concave oblong indentation in the planar solder surface is arranged as a recess with respect to the planar solder surface.

4. The IC package of claim 3, wherein the recess is entirely surrounded by the planar solder surface.

5. The IC package of claim 3, wherein the IC package is a quad flat no-lead (QFN) IC package.

6. The IC package of claim 1, wherein the planar solder surface corresponds to a ground pad.

7. The IC package of claim 6, wherein the at least one we concave oblong indentation in the planar solder surface is arranged as a respective slot formed at an exposed solder surface of the ground pad.

8. The IC package of claim 7, wherein the second curved slot the planar solder surface opposes the at least one curved slot.

9. The IC package of claim 1, wherein the at least two concave oblong indentations in the planar solder surface are arranged as through-holes with respect to the planar solder surface.

10. A printed circuit board (PCB) comprising the IC package of claim 1, wherein the PCB comprises at least one external conductive metal contact, wherein the at least one conductive metal contact and the respective at least one external metal contact are soldered together via solder material.

11. A method for fabricating an integrated circuit (IC) package, the method comprising:
    fabricating a semiconductor die that comprises an IC;
    forming a conductive metal contact comprising a planar solder surface;
    forming at least one concave oblong indentation in the planar solder surface that does not extend to any other surface of the conductive metal contact, the at least one concave oblong indentation being configured to increase surface area of contact of a solder material on the conductive metal contact relative to the planar solder surface;
    coupling the conductive metal contact to the semiconductor die; and
    forming an IC package enclosure over the semiconductor die and partially over the conductive metal contact to form the IC package.

12. The method of claim 11, wherein forming the at least one concave oblong indentation comprises forming a recesss in the planar solder surface.

13. The method of claim 12, wherein the recess is entirely surrounded by the planar solder surface.

14. An integrated circuit (IC) package comprising:
a semiconductor die comprising an IC;
an IC package enclosure that substantially encloses the semiconductor die; and
at least one conductive metal contact on an exterior surface of the IC package enclosure, the conductive metal contact including a planar solder surface facing away from the IC package enclosure, the planar solder surface comprising at least one curved slot surrounded by the planar solder surface and configured to increase surface area of contact of a solder material on the at least one conductive metal contact relative to the planar solder surface.

15. The IC package of claim 14, wherein the at least one curved slot is arranged as a recess with respect to the planar solder surface.

16. The IC package of claim 14, further includes a second curved slot on the planar solder surface.

* * * * *